United States Patent [19]

Sano et al.

[11] Patent Number: 4,914,727

[45] Date of Patent: Apr. 3, 1990

[54] METHOD OF MAGNETIC RESONANCE DYNAMIC IMAGING

[75] Inventors: Koichi Sano, Sagamihara, Japan; Akira Maeda, Gardena, Calif.; Tetsuo Yokoyama, Tokyo; Shigenobu Yanaka, Kashiwa; Hideaki Koizumi, Katsuta, all of Japan

[73] Assignees: Hitachi, Ltd.; Hitachi Medical Corporation, both of Tokyo, Japan

[21] Appl. No.: 313,439

[22] Filed: Feb. 22, 1989

[30] Foreign Application Priority Data

Feb. 25, 1988 [JP] Japan ................................ 63-40808

[51] Int. Cl.⁴ .......................................... G01R 33/20
[52] U.S. Cl. .................................... 324/309; 324/307
[58] Field of Search ............... 324/300, 306, 307, 312, 324/313, 309; 128/653

[56] References Cited

U.S. PATENT DOCUMENTS

| 4,486,708 | 12/1984 | Macouski | 324/309 |
| 4,523,596 | 6/1985 | Macouski | 128/653 |
| 4,528,985 | 7/1985 | Macouski | 324/309 |
| 4,577,152 | 3/1986 | Macouski | 324/309 |
| 4,736,160 | 4/1988 | Sano et al. | 324/312 |
| 4,752,734 | 6/1988 | Wedeen | 324/306 |
| 4,767,992 | 10/1988 | Ueyama | 324/313 |
| 4,844,077 | 7/1989 | Sano et al. | 128/653 |
| 4,857,843 | 8/1989 | Macouski | 324/307 |

Primary Examiner—Michael J. Tokar
Attorney, Agent, or Firm—Antonelli, Terry & Wands

[57] ABSTRACT

A method of MR dynamic imaging comprises the steps of uniformly dividing one scan which is a minimum measurement unit in generating one image data into a plurality of cycles, sequentially extracting one-scan data which are staggered by a predetermined number of cycles, from a series of data derived by repeating the scan a plurality of times in such a manner that the measurement data in each cycle includes high frequency component and low frequency component of the image, and generating image data from the extracted data.

6 Claims, 6 Drawing Sheets

METHOD OF MAGNETIC RESONANCE DYNAMIC IMAGING

BACKGROUND OF THE INVENTION

The present invention relates to a method of imaging a living body tomogram by utilizing a nuclear magnetic resonance phenomenon, and more particularly to a method of imaging a status in a body which varies from time to time. The present invention is useful for medical diagnosis.

Dynamics study for tracing time-sequential changes of a test subject has been normally done in a field of X-ray CT ("Whole-Body X-ray CT Scanner TCT-900S" by Issei Mori et al, TOSHIBA REVIEW, Vol. 42, No. 2, 1987, pages 80–82). In the X-ray CT, a minimum imaging unit capable of generating one image is continuously scanned a plurality of times so that a certain length of measurement data is obtained. There is no discrimination between data with respect to value of data and all data are homogeneous. Thus, one complete image can be generated from a portion of the data corresponding to one scan data extracted from any position in the measurement data between one scan to the next scan. By utilizing the above nature, it is possible to reduce a scan time, from a time actually required for one scan. For example, if one-second scan is continuously effected 30 times and a series of data portions each corresponding to one scan data are extracted from the measurement data while the data portions stagger from each other by 0.3-second area, approximately 100 sheets of images of successive scans started at an interval of 0.3 second are obtained. Thus, the time resolution is improved from one second to 0.3 second.

In a field of magnetic resonance imaging (MRI) which utilizes the nuclear magnetic resonance phenomenon, clinical experiment for the dynamic study has been done ("Dynamic MRI of Small Liver Hemangioma" NMR MEDICINE Vol. 6, Supplement-2, 1986, page (58). However, the method for improving the time resolution used in the X-ray CT is not used by the reason described afterward, and one image is simply generated from each scan.

The X-ray CT makes an image of distribution of X-ray absorptivity while the MRI makes an image of distribution of hydrogen. Accordingly, the images generated thereby relate to different subjects and it is not possible to use the X-ray CT in place of the MRI. Further, the X-ray CT involves a risk of radiation ray problem. Since the MRI takes approximately two minutes for one ordinary imaging, it is possible to observe the status at an interval of approximately two minutes. If a high speed imaging technique which shortens a repetition time is used, one imaging cycle will complete in approximately five seconds. Even in such a case, the time resolution is five seconds which is farely poor compared to that of the X-ray CT to which the method for improving the time resolution is applicable.

In the MRI, the method for improving the time resolution which is used in the X-ray CT cannot be used because the MRI is operated in a different principle than the X-ray CT and the measurement data in the MRI lacks homogenity which the measurement data in the X-ray CT has. The scan in the MRI is conducted by changing a strength of a phase encoded pulse (306 in FIG. 4) for each measurement. FIG. 2 shows an example of application sequence of the phase encoded pulses in a related art. The strength of the phase encoded pulse is monotoneously and constantly increased from a negative maximum to a positive maximum, and one measurement is done at each strength level.

The n strength levels of the phase encoded pulses are discriminated by phase encoded numbers sequentially assigned in the order of strength, and the minimum (negative maximum) strength level is assigned with zero. Thus, the strength $G_p(i)$ of the phase encoded pulse having the phase encoded number 0 is given by $$G_p(i) = 2G_{pmax} \cdot i/n - G_{pmax}$$

where $G_{pmax}$ is the maximum amplitude of the phase encoded pulse, and i is an integer from 0 to n−1. In the related art, the application sequence of the phase encoded pulses is changed by monotoneously increasing (from 0 to n−1) or decreasing (from n−1 to 0) the phase encoded number i with time. FIG. 2A shows a simplified graph for the former case. Usually, n=256.

As shown in FIG. 2A, the scan with stepwise change of the strength of the phase encoded pulse from 0 to n−1 with time is sequentially effected three times, and a series of data portions each corresponding to one scan data which is staggered from others by ⅓ scan area are extracted from the measurement data in accordance with the method for improving the time resolution used in the X-ray CT, and images are generated from the respective data portions. FIG. 2B schematically shows the above process. A group of lines 404, 405 and 406 which are collectively designated by 401 show ranges of one-scan data of the measurement data 400, each of which is used to generate one image. FIG. 2C shows one-scan measurement data. As shown in FIG. 2C, a measurement signal is sampled in a measurement space. The number of times of sampling is usually 256. The measurement signals for the phase encoded pulses 0 to n−1 are transformed by two-Dimension Fourier Transform (2DFT) to obtain a tomogram image. In general, when the strength of the phase encoded pulse is high, a high frequency component of the image is measured. This area is designated by numeral 402. On the other hand, when the strength is low, a low frequency component of the image is measured. This area is designated by numeral 403.

The strength of the phase encoded pulse of FIG. 2A stepwisely changes from the negative maximum to the positive maximum. Thus, at an early stage of the scan, the high frequency component 402 of the image is measured, at a middle stage of the scan, the low frequency component 403 is measured, and at a late stage of the scan, the high frequency component 402 is again measured.

In the X-ray CT, the scan is effected by rotating an imaging mechanism around a test subject. Thus, the scans starting from any initial angles are equivalent. In this sense, the measurement data is homogeneous, and the above method for extracting the one-scan data from the continuous data with each one-scan data staggering from others is successful. On the other hand, in the MRI, the scan is effected by changing the strength of the phase encoded pulse and the strength of the phase encoded pulse relates to the frequency component of the generated image, as shown in FIG. 2C. As a result, the measurement data in the MRI lacks the homogeneity. In FIG. 2B, the image generated from the data in the range 405 has the high frequency component thereof updated from ① to ①' compared to the high frequency component 402 of the image generated from the data in the range 404. The image generated from the data in the range 406 has the low frequency component thereof updated from ② to ②' compared to the low frequency component 403 of the image generated from the data in the range 405. Since the high frequency component and the low frequency component are separately updated, the continuity of the series of images is very poor.

SUMMARY OF THE INVENTION

It is an object of the present invention to improve an application sequence of phase encoded pulses in order to allow an improvement of a time resolution in the MRI in the same manner as that done in the X-ray CT.

In accordance with the present invention, one scan necessary to generate one image is uniformly divided into a plurality of cycles, and a strength of a phase encoded pulse is substantially uniformly distributed to those cycles. Namely, the strength of the phase encoded pulse is changed in such a manner that a low frequency component and a high frequency component of the image are uniformly included in one-cycle scan data. As a result, the image data may be generated with one-cycle staggering.

For example, one scan is uniformly divided into m cycles, and in each cycle, the phase encoded levels of m levels are sequentially applied at an equal interval. Such scan is effected continuously a plurality of times, and a series of data portions each corresponding to one-scan data with each data portion staggering from others by a predetermined number of cycles (for example, one cycle) are extracted from the measurement data. An image is generated from each measurement data portion. The image generation process may be effected in parallel to the scan so long as the measurement data necessary for generating one image is collected.

In accordance with the distribution of the phase encoded pulse in the present invention, the measurement data produced in each cycle includes all frequency components of the image. In this sense, all measurement data are homogeneous from cycle to cycle. Accordingly, the series of measurement data portions each corresponding to one-scan data extracted by staggering by the predetermined number of cycles are updated by the substitution by the homogeneous data. As a result, the image generated therefrom exhibits high continuity. The parallel execution of the image generation and the scan improves the processing speed.

In accordance with the present invention, a series of MR images at an interval which is much shorter than the scan time can be generated. In other words, the time resolution of the MRI can be improved to a value which is much shorter than the scan time. Accordingly, the time-serial change in the condition in the body can be visualized and observed in a much shorter time than that required in the related art, and more proper diagnosis can be made. Further, the parallel execution of the scan and the image generation shortens the processing time.

DETAILED DESCRIPTION OF THE PREFERRED EMBODIMENTS

Figure 3:
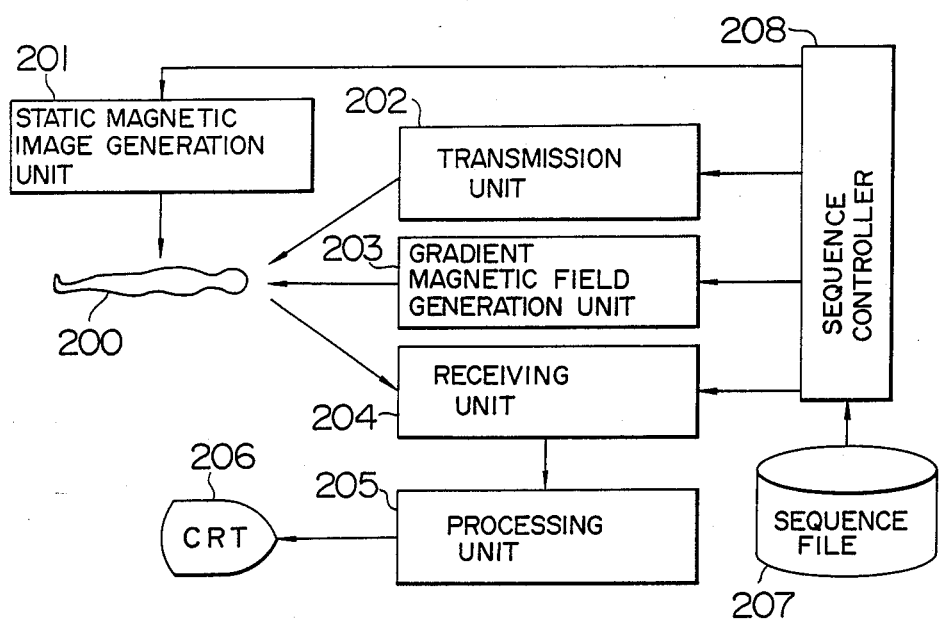
FIG. 3 shows a block diagram of an MRI system to which the present invention is applicable.

FIG. 3 shows an MRI system to which the present invention is applicable. A static magnetic field generation unit 201 generates a uniform static magnetic field. A transmission unit 202 generates a high frequency pulse magnetic field for exciting spin. A gradient magnetic field generation unit 203 generates x, y and z gradient magnetic fields of mutually orthogonal three-dimensional coordinates in a space in which a test subject is to be placed. A strength of the magnetic field in each direction can be linearly and independently changed. A receiving unit 204 receives an electromagnetic wave radiated from the test subject 200, detects it and converts it to a digital signal, and supplies it to a processing unit 205. The processing unit 205 comprises a CPU, a memory and an I/O interface circuit. It processes the data supplied from the receiving unit 204 to generate image data which is displayed on a CRT display 206. A pulse sequence file 207 holds control information for controlling the operation sequences of the units 201 to 204. A sequence controller 208 reads the control information from the pulse sequence file 207 and controls the operations of the units 201 to 204 in accordance with the control information.

Figure 4:
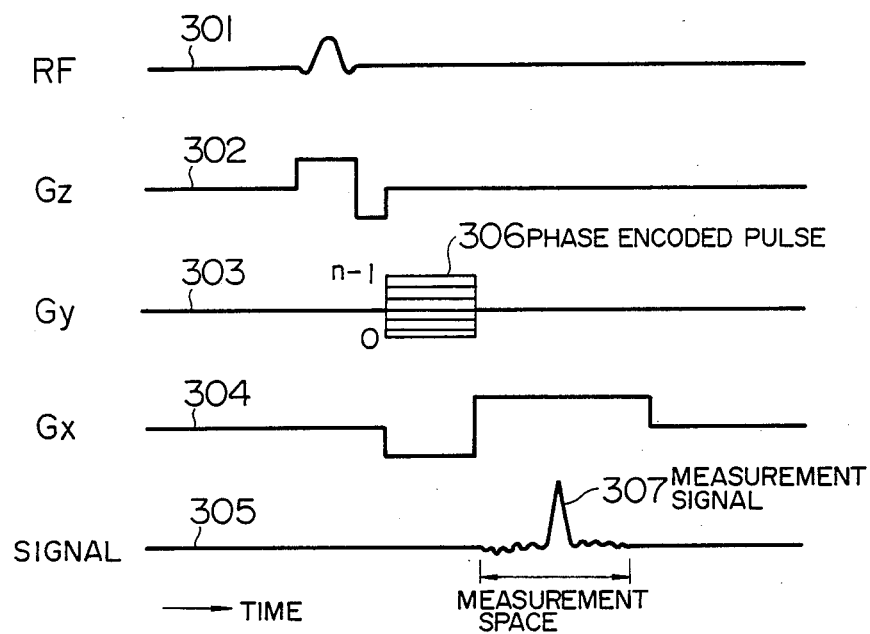
FIG. 4 shows a pulse sequence used in the system of FIG. 3.

FIG. 4 shows a pulse sequence in the system of FIG. 3. It is generated under the control of the sequence controller 208 in accordance with the control information from the pulse sequence file 207. RF 301 denotes a timing of the high frequency pulse magnetic field generated by the transmission unit 202. Gradient magnetic fields Gz 302, Gy 303 and Gx 304 denote timings of the z, y and x direction gradient magnetic fields generated by the gradient magnetic fields generation unit 203. Signal 305 denotes a timing for the receiving unit 204 to measure a measurement data signal 307. A frequency of the RF 301 and a z-direction slice sectional layer of the Gz 302 are selected. The y-direction position separation is effected by the Gy 303, and the x-direction position separation is effected by the Gx 304. Since the y-direction separation cannot be effected in one time, the strength of the Gy 303 is changed and the data 307 is measured for each strength. Normally, the Gy 306 changes over 256 different strengths and the measurement is effected 256 times in one scan. The gradient magnetic field (y-direction gradient magnetic field in the present example) which causes the change of strength during the scan is given by the phase encoded pulse 306. As described earlier, in the related art, the strength of the phase encoded pulse 306 is monotoneously changed in one direction as shown in FIG. 2.

Figure 1:
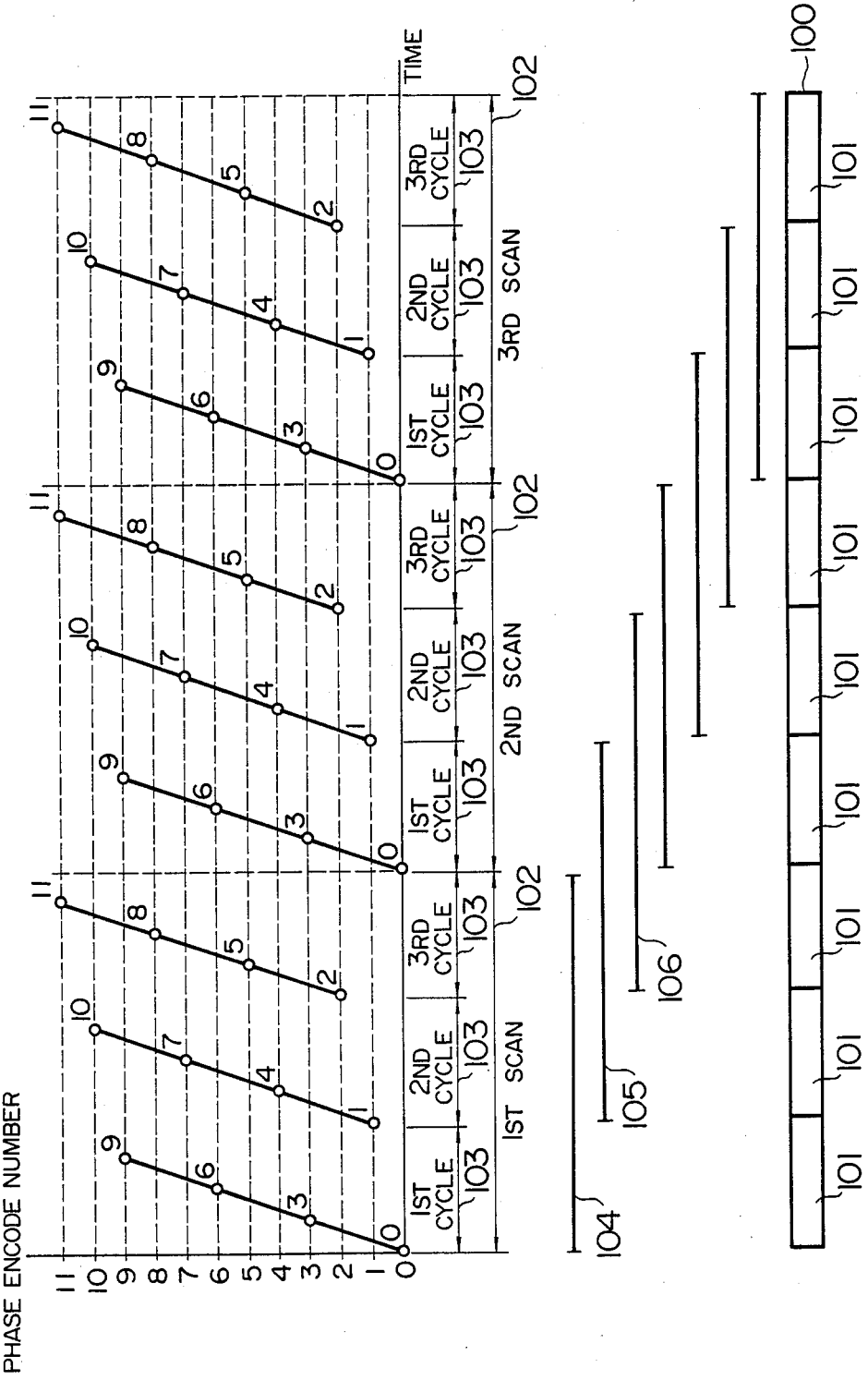
FIG. 1 shows an application sequence of phase encoded pulses in accordance with the present invention and extraction of one-scan data from measurement data.
Figure 2A:
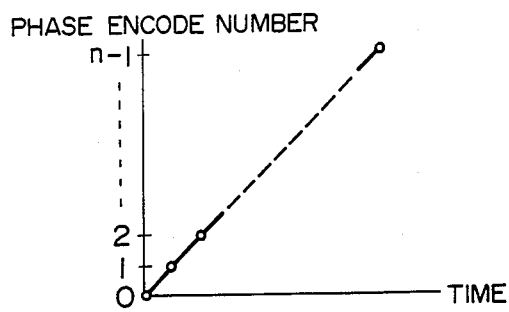
FIG. 2A shows an application sequence of phase encoded pulses.
Figure 2B:
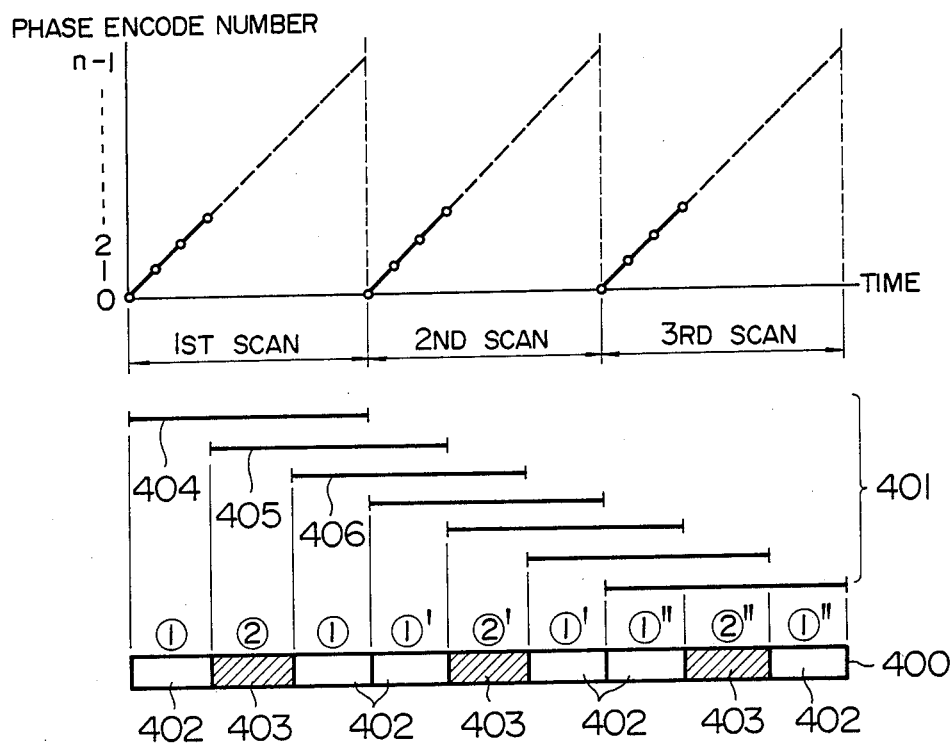
FIG. 2B shows three continuous measurement by the phase encoded pulses of FIG. 2A.
Figure 2C:
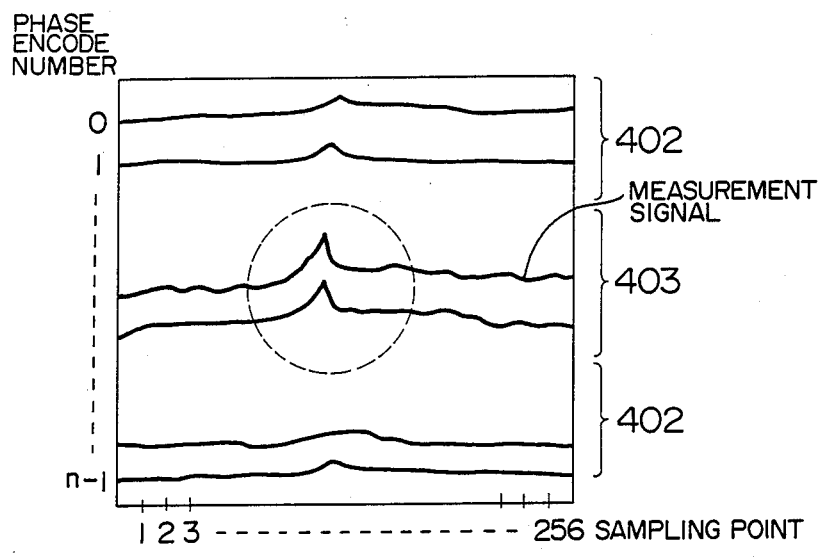
FIG. 2C shows a relationship between the measurement data by the phase encoded pulse of FIG. 2A and a tomogram image.
Figure 2C:
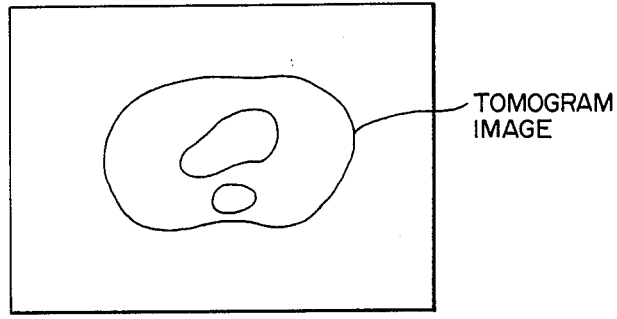

In accordance with the present invention, one scan is uniformly divided into a plurality of cycles, and the strengths of the phase encoded pulses, that is, the phase encoded numbers are uniformly distributed to those cycles. FIG. 1 shows an example of application sequence of the phase encoded pulses in accordance with the present invention. A scan 102 by 12-level phase encoded pulses is effected continuously three times. Each scan comprises three cycles 103. From the measurement data 100 obtained from those scans, data portions for one-scan ranges 104, 105 and 106 which are staggered from each other by one cycle ($\frac{1}{3}$ scan) are extracted, and images are generated from those data portions.

In the present example, the strength of the phase encoded pulse for the phase encode number i is divided into the following three groups.

Group 0: i=3j

Group 1: i=3j+1

Group 2: i=3j+2 (j=0, 1, 2, 3)

Those groups are assigned to the respective cycles in the group number sequence. In the first cycle j is sequentially incremented from 0 in the group 0 so that the phase encoded pulses having the strengths of numbers 0, 3, 6, 9 are applied in this sequence. In the second cycle, the phase encoded pulses having the strengths of numbers 1, 4, 7, 10 are applied. In the third cycle, the phase encoded pulses having the strengths of numbers 2, 5, 8, 11 are applied. Thus, the first scan is terminated. Then, the second and third scans are effected in the same sequence.

By the above application sequence of the phase encoded pulses, the phase encoded pulses having high strength and the phase encoded pulses having low strength are uniformly distributed in each cycle. Accordingly, each of the measurement data blocks 101 substantially and uniformly includes the low frequency components to the high frequency components of the image. In this sense, the data blocks 101 have substantially identical nature, or they are homogeneous. As a result, the images generated from the measurement data in the series of one-scan ranges 104, 105, 106 which are staggered from each other by one cycle are data homogeneous to each other because all data portions which are updated for each staggering include the low frequency component to the high frequency component of the image. As a result, there exists high continuity between the images.

Figure 5:
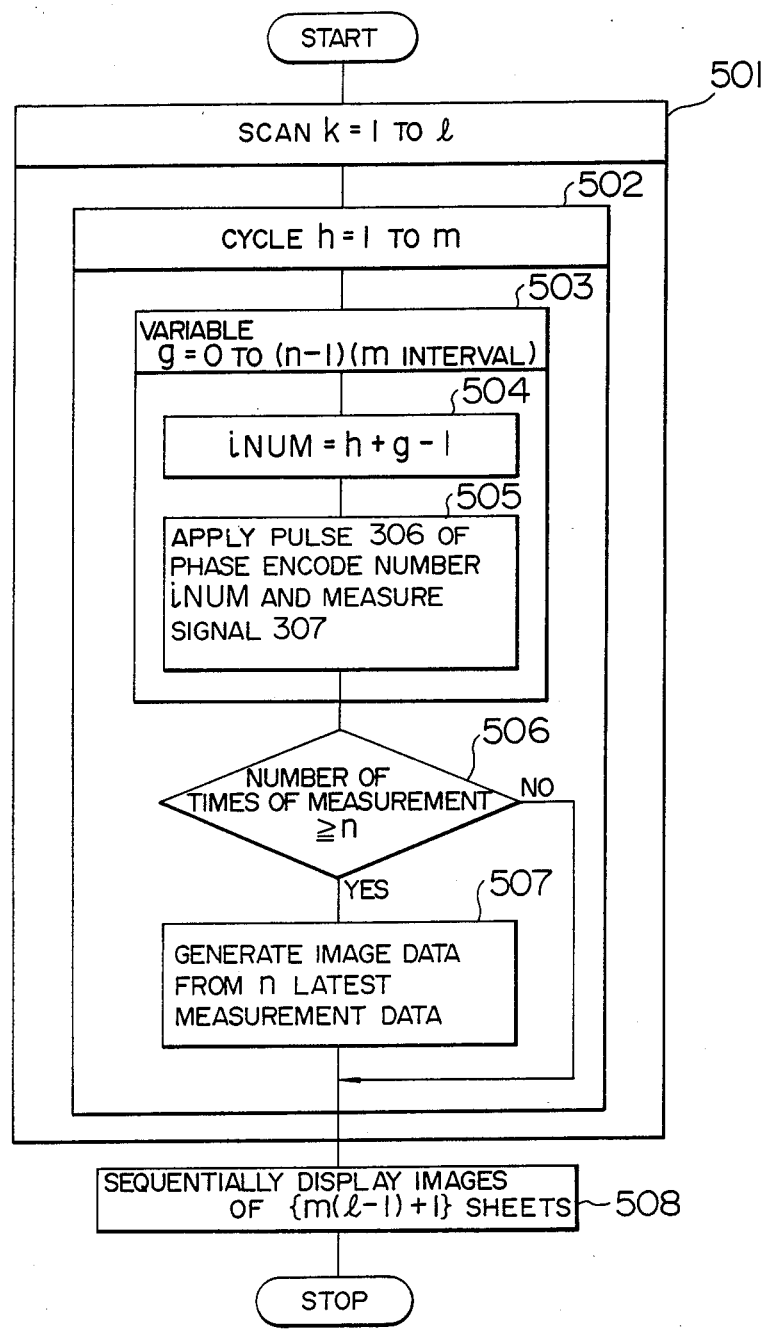
FIG. 5 shows a flow chart of one embodiment of the present invention.

A flow chart in FIG. 5 shows a process for generating a series of images staggered by one cycle by effecting the scan shown in FIG. 1 continuously l times, where n is the number of different strengths of the phase encoded pulses and m is the number of cycles in one scan.

Step 501: Scan k is effected l times. For each scan, a step 502 is performed. After the l times of scan, the process proceeds to a step 508.

Step 502: Cycle h is repeated m times. For each cycle, steps 503 to 507 are performed m times. After the m-times repetition of the cycle, one scan is completed and the process returns to the step 501.

Step 503: A variable g for determining the phase encode number is incremented from 0 to n−1 at m increment. For each g, steps 504 and 505 are performed. There are n/m different g's between 0 and n−1. When the measurement for n/m equal to g's is completed, one cycle is completed and the process proceeds to a step 506.

Step 504: The phase encode number i NUM is calculated by the following formula.

iNUM=h+g−1 where h: the cycle number in the scan

A specific example of calculation in FIG. 1 is shown below.

Since the number of cycles in one scan in FIG. 1 is 3, g in the step 503 is incremented by 3. Since n=12, m has the values 0, 3, 6 and 9. The phase encode number iNUM in the first cycle in the first scan is determined as shown below, where h=1 and g=0, 3, 6, 9.

| iNUM | = | h | + | g | − | 1 |
|---|---|---|---|---|---|---|
| . | | . | | . | | . |
| . | | . | | . | | . |
| . | | . | | . | | . |
| 0 | = | 1 | + | 0 | − | 1 |
| 3 | = | 1 | + | 3 | − | 1 |
| 6 | = | 1 | + | 6 | − | 1 |
| 9 | = | 1 | + | 9 | − | 1 |

The phase encode number iNUM in the second cycle in the first scan is determined as shown below, where h=2 and g=0, 3, 6, 9.

| iNUM | = | h | + | g | − | 1 |
|---|---|---|---|---|---|---|
| . | | . | | . | | . |
| . | | . | | . | | . |
| . | | . | | . | | . |
| 1 | = | 2 | + | 0 | − | 1 |
| 4 | = | 2 | + | 3 | − | 1 |
| 7 | = | 2 | + | 6 | − | 1 |
| 10 | = | 2 | + | 9 | − | 1 |

Step 505: The measurement signal 307 is measured by the pulse sequence of FIG. 4 by using the phase encoded pulses 306 having the strengths determined by $$G_p\text{iNUM}) = 2G_{pmax} \cdot \text{iNUM}/n - G_{pmax}$$

where $G_{pmax}$ is a maximum amplitude of the phase encoded pulse.

Then, the process returns to the step 503.

Step 506: If the accumulated number of times of measurement does not reach n, it means that measurement data necessary to generate one image has not yet been collected, and the process returns to the step 502. If it reaches n, the process proceeds to a step 507.

Step 507: The measurement data derived from the n latest measurement are arranged in the sequence of the phase encode numbers 0 to n−1, and the image data is generated by applying two-Dimentional Fourier Transform (2DFT) therefrom.

When the data 104 by the first scan 102 of FIG. 1 is produced, the first image data is generated by applying 2DFT process. As the image data is generated, the process returns to the step 502 where the next scan is started and the measurement is effected. For example, in FIG. 1, at the end of the first cycle of the second scan, the n latest measurement data 105 for one scan in which $\frac{1}{3}$-scan data has been updated are produced, and one image data is generated from those measurement data which are rearranged in the sequence of phase encode number.

Step 508: At this step, l scans have been completed and total of {m(l−1)+1} images data have been prepared. The images are then sequentially displayed on the CRT display 206.

If the processing unit 205 has no sufficient processing ability, the image data generation step 507 cannot be performed in parallel to the measurement. In such a case, it is necessary to give a priority to the measurement and start the step 507 after the measurement has been completed. Other wire, the measurement data would include dropout and the continuity of image would be lost.

In general, in order to generate a series of images which are staggered from each other by (1/m) scan, one scan is uniformly divided into m cycles and the phase encode numbers are distributed to the m groups in the following manner.

Group 0:    $i = m \cdot j$
Group 1:    $i = m \cdot j + 1$
Group 2:    $i = m \cdot j + 2$
.
.
.
Group (m − 1):  $i = m \cdot j + m - 1$ $\{j = 0, 1, 2, \ldots (n/m) - 1\}$ In other words, the group number to which the phase encode number i belongs is equal to a residue produced when i is divided by m.

For example, for the phase encode numbers 0, 3, 6, 9 of FIG. 1, the residue produced by the division by m=3 is zero. Accordingly, the group 0 is assigned. For the phase encode numbers 2, 5, 8, 11, the residue produced by the division by m=3 is 2. Accordingly, the group 2 is assigned.

In order to facilitate the control, those groups are assigned to m cycles. The groups 0 to (m−1) may be sequentially assigned to the cycles 1 to m, respectively, or the groups 0 to (m−1) may be sequentially assigned to the cycles m to 1, respectively. It is not necessary to assign in the ascending or descending order of the group numbers but they may be assigned in a random sequence. However, the assignment is preferably fixed throughout the scan. The sequence to use the phase encode numbers in the assigned group in each cycle is arbitrary. However, from the standpoint of easiness of control, it is preferable to use the ascending or descending order throughout the scan. A series of measurement data portions each of which correspond to one-scan data staggered from others by a plurality of cycles may be extracted to prepare visual images. For example, when the data portions are staggered by p cycles, sequential images at (p/m) scan interval are produced.

Figure 6:
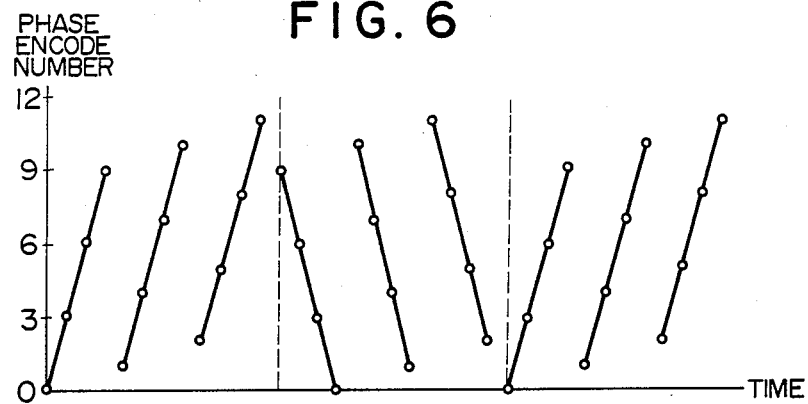
FIGS. 6, 7 and 8 show other examples of application sequence of the phase encoded pulses in the present invention.
Figure 7:
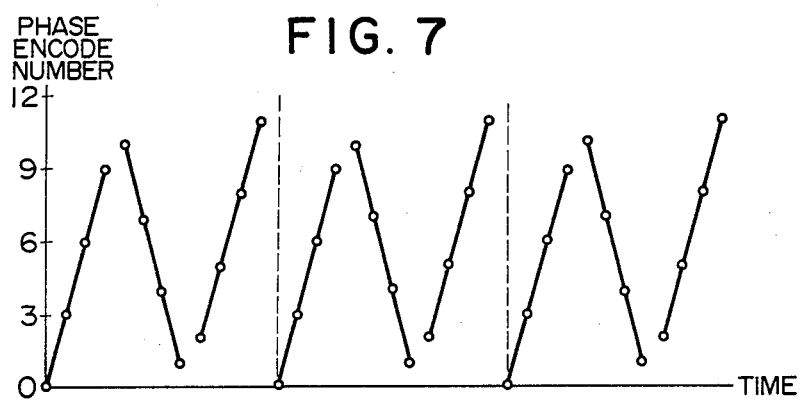
Figure 8:
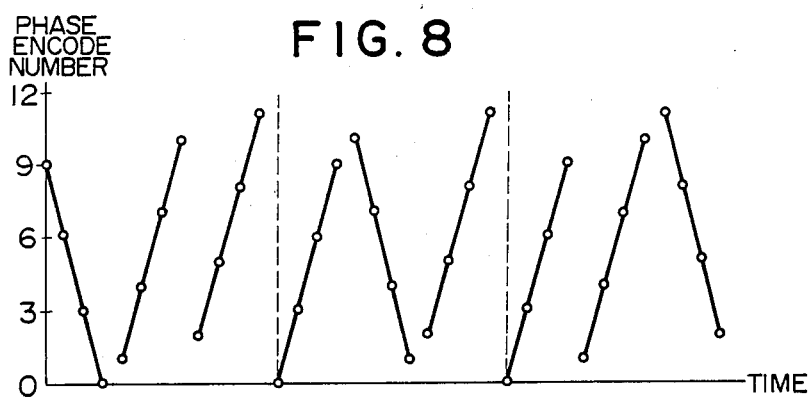

FIGS. 6 to 8 show other examples of application sequence of the phase encoded pulses under the same condition as that of FIG. 1, that is, the number n of strength levels of the phase encoded pulse is 12, the number m of cycles in one scan is 3, and the total number l of scan is 3. In FIG. 6, the application sequence of the phase encoded pulses are opposite to that of FIG. 1 in all cycles of the second scan. In FIG. 7, the application sequence of the phase encoded pulses is opposite to that of FIG. 2 in the second cycle of each scan. In FIG. 8, the application sequences of the phase encoded pulses in any two scans are different from each other. In each of those examples, the phase encode numbers used in each cycle are fixed throughout the cycle. Thus, the substantially same continuity of image as that of FIG. 1 is attained in spite of the difference in the application sequence of the phase encoded pulse.

The total number l of scans, the number m of cycles in the scan, the assignment of the phase encode number group to each cycle and the sequence to use the phase encoded numbers in each cycle of each scan may be designated in any manner by the control information stored in the pulse sequence file 207, without modifying a hardware.

We claim:

1. A method of MR dynamic imaging comprising the steps of:
   (a) substantially uniformly dividing one scan which is a minimum measurement unit in generating one image data, into a plurality of cycles;
   (b) distributing to each of said cycles a plurality of phase encoded pulses of different strengths to permit measurement from high frequency component to low frequency component of the image;
   (c) generating the distributed phase encoded pulses and measuring MR signals;
   (d) repeating said scan a plurality of times;
   (e) sequentially extracting one-scan data staggered by a predetermined number of cycles from the data derived from the repetitive scan;
   (f) rearranging the extracted data in the sequence of strength of the phase encoded pulses; and
   (g) generating image data from the rearranged data.

2. A method of MR dynamic imaging according to claim 1, wherein said distributing step distributes the phase encoded pulses in such a manner that the phase encoded pulse numbers in one cycle are at m interval, where m is the number of cycles in one scan, n is the number of strength levels of the phase encoded pulses, and the phase encoded pulse number having a minimum strength is assigned with 0, the phase encoded pulse numbers of higher strength are assigned with 1, 2, 3, . . . , and the phase encoded pulse number having a maximum strength is assigned with (n−1).

3. A method of MR dynamic imaging according to claim 2, wherein the distributing step with m interval includes a step of dividing the phase encoded pulses into the following m groups and assigning each of said groups to each cycle.

Group 0: $i = m \cdot j$

Group 1: $i = m \cdot j + 1$

Group 2: $i = m \cdot j + 2$

..........................
..........................

Group (m − 1): $i = m \cdot j + m - 1$ where i is the phase encoded pulse number, and j=0, 1, 2, . . . , (n/m)−1

4. A method of MR dynamic imaging according to claim 1, wherein said measuring step, said extracting step, said rearranging step and said image data generating step are parallelly executed after the measurement data necessary for generating one image data has been prepared.

5. A method of MR dynamic imaging according to claim 2, wherein said measuring step, said extracting step, said rearranging step and said image data generating step are parallelly executed after the measurement data necessary for generating one image data has been prepared.

6. A method of MR dynamic imaging according to claim 3, wherein said measuring step, said extracting step, said rearranging step and said image data generating step are parallelly executed after the measurement data necessary for generating one image data has been prepared.

* * * * *